US008694864B1

(12) United States Patent
Ngo

(10) Patent No.: US 8,694,864 B1
(45) Date of Patent: Apr. 8, 2014

(54) PARALLEL PROCESSING ERROR DETECTION AND LOCATION CIRCUITRY FOR CONFIGURATION RANDOM-ACCESS MEMORY

(75) Inventor: Ninh D. Ngo, Palo Alto, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 13/617,745

(22) Filed: Sep. 14, 2012

Related U.S. Application Data

(60) Division of application No. 12/917,441, filed on Nov. 1, 2010, now Pat. No. 8,281,215, which is a continuation of application No. 11/436,967, filed on May 16, 2006, now Pat. No. 7,844,886.

(51) Int. Cl.
  *G11C 29/00* (2006.01)
(52) U.S. Cl.
  USPC .......................................... 714/769; 714/725
(58) Field of Classification Search
  USPC ................................................ 714/725, 769
  See application file for complete search history.

(56) References Cited

U.S. PATENT DOCUMENTS

| | | | |
|---|---|---|---|
| 4,589,112 A | 5/1986 | Karim | |
| 4,949,342 A | 8/1990 | Shimbo et al. | |
| 4,964,130 A * | 10/1990 | Bowden et al. | 714/764 |
| 5,177,747 A | 1/1993 | Capps et al. | |
| 5,408,476 A | 4/1995 | Kawai et al. | |
| 5,432,801 A | 7/1995 | Hepier | |
| 6,104,211 A | 8/2000 | Alfke | |
| 6,150,836 A | 11/2000 | Abbott | |
| 6,191,614 B1 | 2/2001 | Schultz et al. | |
| 6,195,780 B1 | 2/2001 | Dravida et al. | |
| 6,237,124 B1 | 5/2001 | Plants | |
| 6,429,682 B1 | 8/2002 | Schultz | |
| 6,438,569 B1 | 8/2002 | Abbott | |
| 6,531,888 B2 | 3/2003 | Abbott | |
| 6,604,222 B1 | 8/2003 | Jensen | |
| 6,779,150 B1 | 8/2004 | Walton et al. | |
| 7,036,059 B1 | 4/2006 | Carmichael et al. | |
| 7,099,190 B2 | 8/2006 | Noguchi | |
| 7,292,950 B1 * | 11/2007 | Resnick | 702/85 |
| 7,398,449 B1 | 7/2008 | Normoyle et al. | |
| 7,453,728 B2 | 11/2008 | Noguchi | |
| 7,634,713 B1 | 12/2009 | Ngo | |

(Continued)

OTHER PUBLICATIONS

Lewis et al., U.S. Appl. No. 60/793,946.

(Continued)

*Primary Examiner* — M. Mujtaba K Chaudry
(74) *Attorney, Agent, or Firm* — Treyz Law Group; G. Victor Treyz; David C. Kellogg

(57) ABSTRACT

Error detection and error location determination circuitry is provided for detecting and locating soft errors in random-access-memory arrays on programmable integrated circuits. The random-access-memory arrays contain rows and columns of random-access-memory cells. Some of the cells are loaded with configuration data and produce static output signals that are used to program associated regions of programmable logic. Cyclic redundancy check error correction check bits are computed for each column of an array. The cyclic redundancy check error correction check bits are stored in corresponding columns of cells in the array. During normal operation of an integrated circuit in a system, the cells are subject to soft errors caused by background radiation strikes. The error detection and error location determination circuitry uses parallel processing to continuously monitor the data to identify the row and column location of each error.

19 Claims, 11 Drawing Sheets

(56) References Cited

U.S. PATENT DOCUMENTS

| | | | |
|---|---|---|---|
| 7,647,537 B2 * | 1/2010 | Miyake et al. | 714/725 |
| 2002/0063577 A1 | 5/2002 | Abbott | |
| 2004/0019835 A1 * | 1/2004 | Marisetty et al. | 714/48 |
| 2004/0061060 A1 | 4/2004 | Layman et al. | |
| 2004/0237023 A1 * | 11/2004 | Takahashi et al. | 714/768 |
| 2006/0036913 A1 * | 2/2006 | Krasnansky | 714/36 |
| 2007/0011575 A1 | 1/2007 | Koktan et al. | |
| 2007/0011578 A1 * | 1/2007 | Lewis et al. | 714/763 |
| 2007/0043983 A1 | 2/2007 | Kuo | |
| 2007/0156390 A1 * | 7/2007 | Guenthner et al. | 703/27 |
| 2007/0234101 A1 * | 10/2007 | Koktan et al. | 714/2 |

OTHER PUBLICATIONS

Ngo, U.S. Appl. No. 12/608,835, filed Oct. 29, 2009.
Ngo, U.S. Appl. No. 12/917,441, filed Nov. 1, 2010.
Ngo, U.S. Appl. No. 13/618,097, filed Sep. 14, 2012.

* cited by examiner

PARALLEL PROCESSING ERROR DETECTION AND LOCATION CIRCUITRY FOR CONFIGURATION RANDOM-ACCESS MEMORY

This application is a division of patent application Ser. No. 12/917,441, filed Nov. 1, 2010 now U.S. Pat. No. 8,281,215, which is a continuation of patent application Ser. No. 11/436,967, filed May 16, 2006, now U.S. Pat. No. 7,844,886, each of which is hereby incorporated by referenced herein in its entirety.

BACKGROUND

This invention relates to integrated circuits such as programmable logic device integrated circuits, and more particularly, to circuitry for detecting and locating soft errors in integrated circuits.

Programmable logic devices are a type of integrated circuit that can be programmed by a user to implement a desired custom logic function. In a typical scenario, a logic designer uses computer-aided design tools to design a custom logic circuit. When the design process is complete, the tools generate configuration data. The configuration data is loaded into programmable logic device memory elements to configure the devices to perform the functions of the custom logic circuit.

Programmable logic device memory elements are often based on random-access-memory (RAM) cells. Because the RAM cells are loaded with configuration data during device programming, the RAM cells are sometimes referred to as configuration memory or configuration random-access-memory cells (CRAM).

During normal operation of a programmable logic device, loaded CRAM cells produce static output signals that are applied to the gates of metal-oxide-semiconductor (MOS) field-effect transistors (e.g., pass transistors). The CRAM output signals turn some transistors on and turn other transistors off. This selective activation of certain transistors on the device customizes the operation of the device so that the device performs its intended function.

When operating in a system, programmable logic devices are subject to environmental background radiation. Particularly in modern programmable logic devices that contain large numbers of CRAM cells, there is a possibility that a radiation strike on a CRAM cell will cause the CRAM cell to change its state. For example, a CRAM cell storing a "one" configuration bit may flip its state so that the cell erroneously stores a "zero" bit. When a CRAM cell changes state, the transistor being controlled by that CRAM cell will be placed into an erroneous state. The transistor might, for example, be turned on when it should have been turned off.

Radiation-induced errors that arise in configuration random-access-memory cells are sometimes referred to as soft errors. One way in which soft errors can be addressed is to change the design of the configuration random-access-memory cells. However, changes to the configuration random-access-memory cells can introduce undesired circuit complexity and can consume additional circuit real estate. As a result, it is often necessary to use a configuration random-access-memory cell architecture that occasionally produces soft errors.

Conventional programmable logic devices include error detection circuitry that continuously monitors an entire array of configuration random-access-memory cells. If an error is detected in the array, an error flag may be set. Systems that require highly reliable operations can monitor the status of the error flag to determine whether the programmable logic device has experienced any soft errors. So long as no errors are present, the system allows the programmable logic device to operate normally. If, however, the state of the error flag indicates that one of the configuration random-access-memory cells on the device has exhibited a soft error, the system can reconfigure the device by reloading the original configuration data into the configuration random-access-memory cells.

Because most soft errors do not produce permanent circuit damage, the process of reloading the original configuration data into a programmable logic device that has experienced a soft error is generally successful in restoring normal system operation. However, the reloading process can be disruptive to system operations, particularly when the programmable logic device is being used in a sensitive system in which fault-free operation is desired.

In some situations, soft errors in CRAM cells do not disrupt device operation. For example, a soft error in a CRAM cell that is not being used to implement part of a user's logic design may not adversely affect the normal operation of a device. With conventional programmable logic devices it is generally not possible to determine whether or not critical circuitry will be affected by a soft error, because conventional error detection circuitry is unable to determine the location of the soft error.

It would therefore be desirable to be able to provide integrated circuits such as programmable logic device integrated circuits with circuitry for detecting and locating soft errors in configuration random-access-memory.

SUMMARY

In accordance with the present invention, integrated circuits such as programmable logic device integrated circuits are provided with error detection and error location determination circuitry. The error detection and error location determination circuitry continuously monitors the configuration random-access-memory cells. If an error is detected, the error detection and error location determination circuitry determines the location of the error. The location is preferably determined at the bit level. With this type of arrangement, the row and column of a random-access-memory cell array that contains a detected soft error can be identified. Identifying the bit position of soft errors allows error control logic to take appropriate actions such as reloading an original set of configuration data into the configuration random-access-memory cells or, if possible, foregoing the reloading process to avoid disrupting operation of the integrated circuit.

Each programmable logic device contains an array of random-access-memory cells. Each array contains rows and columns of configuration random-access-memory cells that are used for storing configuration data and contains rows and columns of error-correction-code cells that are used for storing corresponding error-correction-code data. The error-correction-code data may be, for example, 16-bit cyclic redundancy check words.

Columns of the array form data frames. The error detection and error location determination circuitry processes each frame of data to determine whether a soft error has occurred. The error detection and error location determination circuitry uses a parallel processing architecture. With one suitable arrangement, the error detection and error location determination circuitry contains multiple one-bit cyclic redundancy check processing circuits. The processing circuits receive data from the array in parallel. Each processing circuit produces a syndrome output signal. The error detection and error location determination circuitry contains syndrome pattern detectors corresponding to each of the one-bit cyclic redundancy check processing circuits. The syndrome pattern detectors monitor the syndrome outputs of the one-bit cyclic redundancy check processing circuits to determine the bit position of any detected error. A counter that is cycled during cyclic redundancy check processing operations is used to determine the byte-position of a detected error within the frame.

If an error is detected, a detected error signal may be taken high. If the bit position of an error within a frame is determined, a multi-bit location signal may be generated that indicates the error's location within the frame. Information on which frame contains the error may also be provided in the form of a multi-bit signal. Taken together, the multi-bit location signals provide sufficient information to locate detected soft errors by their bit position in the array (i.e., by row and column).

Further features of the invention, its nature and various advantages will be more apparent from the accompanying drawings and the following detailed description of the preferred embodiments.

DETAILED DESCRIPTION

Figure 1:
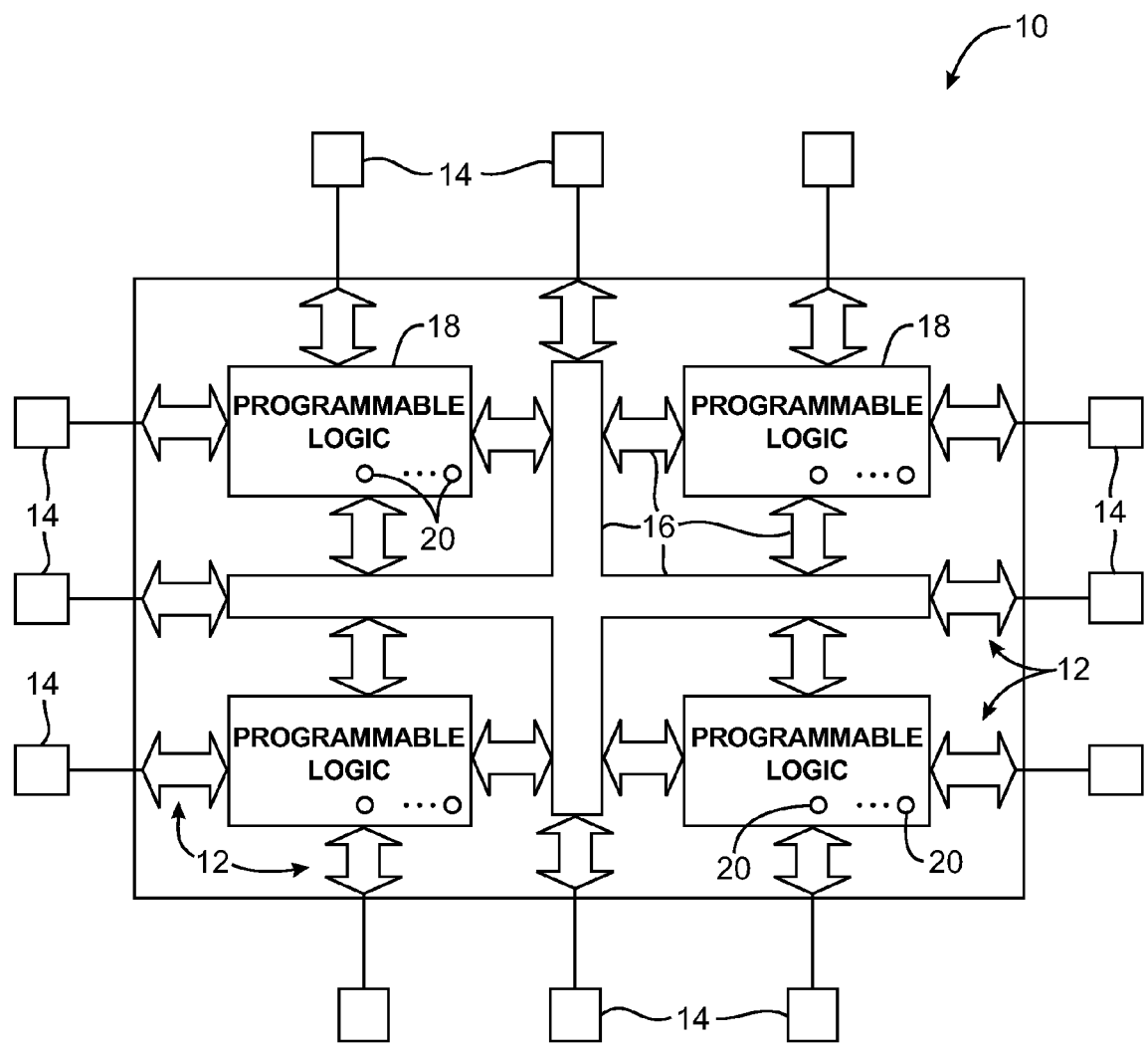
FIG. 1 is a diagram of an illustrative programmable logic device in accordance with the present invention.

The present invention relates to integrated circuits containing circuitry for detecting and locating soft errors in volatile memory elements. The integrated circuits contain programmable circuitry. The programmable circuitry is programmed to perform a custom function by loading configuration data into the volatile memory elements. With one suitable configuration, the volatile memory elements are random-access-memory (RAM) cells.

The integrated circuits used with the present invention may be programmable logic device integrated circuits or programmable integrated circuits that contain programmable circuitry but that are not typically referred to as programmable logic devices. For example, the invention may be used with digital signal processing circuits containing volatile memory elements and programmable circuitry, microprocessors containing volatile memory elements and programmable circuitry, application specific integrated circuits containing volatile memory elements and programmable circuitry, or any other suitable integrated circuit. The present invention will generally be described in the context of programmable logic device integrated circuits and programmable logic device random-access-memory cells that are loaded with configuration data as an example.

In a typical scenario, a programmable logic device integrated circuit is loaded with configuration data to customize the device. The configuration data is loaded into random-access-memory (RAM) cells, which are sometimes referred to as configuration random-access-memory (CRAM) cells. The CRAM cells are generally arranged in an array having numerous rows and columns. Modern programmable logic devices may contain CRAM arrays with thousands or millions of CRAM cells. The columns of a memory cell array are typically referred to as frames. A frame may contain any suitable number of CRAM cells. For example, a frame may contain 6000 CRAM cells. If background radiation causes the state of any of the 6000 CRAM cells that are in use to flip, the operation of the programmable logic device may be disrupted.

To ensure proper detection and location of CRAM soft errors, an additional array of random-access-memory cells is included on the programmable logic device. During configuration data loading operations, error correction check bits are computed for each frame of configuration data. The error correction check bits are stored in the additional array of RAM cells. Because the additional RAM cells are used to store error correction check bits, the RAM cells are sometimes referred to as error-correction-code (ECC) RAM cells. Similarly, the additional array of RAM cells is sometimes referred to as the ECC RAM array or ECC array. The ECC RAM cells and CRAM cells may be fabricated as a unitary array.

After the configuration data has been loaded onto the programmable logic device, the programmable logic device can be used in a system. During normal operations, each CRAM cell produces a static output signal that controls an associated component in the programmable logic of the programmable logic device and configures the programmable logic device to implement a desired custom logic function.

While the programmable logic device is operating normally, circuitry on the device monitors the status of the configuration data. If a soft error is detected, the circuitry locates the position of the error within the CRAM array. With one suitable approach, the exact bit position of the CRAM cell that contains the error is determined (i.e., the row and column of the faulty CRAM cell is located within the CRAM array). The location of the soft error can be used to help determine a suitable error handling response. For example, a user may implement user logic on the programmable logic device that processes the error location information. If the user logic or external logic in the system determines that the error has occurred in a non-critical portion of the CRAM array, the programmable logic device may be allowed to continue its normal operation uninterrupted. The non-critical portion of the array may be, for example, a portion of the array that contains all zeros or all ones (i.e., unused CRAM bits). If it is determined that the CRAM error has occurred in a portion of the CRAM array that contains actively used CRAM bits, the error may be corrected by reloading some or all of the original configuration data into the programmable logic device.

Any suitable type of error correction coding technique may be used in calculating the error correction check bits for the configuration data. With one suitable arrangement, which is described as an example, error correction coding operations are performed using the well-known cyclic redundancy code (CRC) error coding technique. This is merely illustrative. Any suitable error coding technique may be used if desired.

CRC error coding is performed using a CRC computation engine. During configuration data loading operations, CRC error correction check bits are computed using portions of the CRAM array. With one suitable approach, a separate set of CRC error correction check bits is computed for each column of the RAM array. The CRC error correction check bits corresponding to each column of CRAM bits may be stored in the same column of the corresponding ECC RAM array (i.e., as part of a frame that contains the corresponding column of CRAM data). The CRC error correction check bits provide coverage for all of the bits in the frame including the CRAM bits and the CRC bits.

During normal operation of the programmable logic device, error detection and error location determination circuitry systematically examines the contents of the RAM array. Processing is performed on a frame-by-frame basis. If no soft errors are present in a frame, processing can continue to a subsequent frame. Once all frames have been checked successfully, processing can loop back to the initial frame. The checking process can take place continuously, so that errors are detected quickly.

When the error detection and error location determination circuitry determines that an error has occurred, the error detection and error location determination circuitry attempts to locate the error. During location processing, the frame of data being processed is shifted through the error detection and error location determination circuitry. Parallel circuitry is used to facilitate rapid processing. Upon successful completion of error location processing, the error detection and error location determination circuitry produces an error location signal. The number of bits in the error location signal depends on the size of the frame. If, for example, each frame in the CRAM array contains 6000 CRAM bits and 16 CRC bits, the error location signal may be provided in the form of a multibit digital signal containing a sufficient number of bits to uniquely specify one of 6016 possible error positions. The location signal from the error detection and error location determination circuitry identifies the row of the array containing the error. A multibit signal specifying the frame that contains the error is used to identify the column that contains the error. If error location processing is unsuccessful, the error detection and error location determination circuitry may produce output signals that indicate that no valid location was identified.

The error detection and error location determination circuitry may be implemented using any suitable architecture. For example, the error detection and error location determination may use a parallel processing architecture based on eight parallel one-bit cyclic redundancy check processing circuits.

During error location processing, the configuration data and cyclic redundancy check data are clocked through a set of parallel cyclic redundancy check processing circuits. A feedback path is used to connect the cyclic redundancy check processing circuits in a loop. The cyclic redundancy check processing circuits each produce an separate output signal pattern. The signal patterns correspond to cyclic redundancy check syndrome computations. The syndrome output pattern from each cyclic redundancy check circuit is compared to a predefined syndrome pattern. If there is no match, it is not possible to determine the location of the error. If, however, the output pattern of a given cyclic redundancy check processing circuit matches the predefined pattern, the error detection and error location determination circuitry produces a valid location signal at its output.

The location signal that is produced by the error detection and error location determination circuitry can be used to take appropriate corrective actions. In general, any suitable actions may be taken when an error is detected and located. For example, the location of the CRAM error can be compared to the known locations of programmed CRAM bits. If the CRAM error has occurred in an unused portion of the CRAM array, the device may be allowed to function normally. If the CRAM error is located within a portion of the CRAM array that contains configuration data, the CRAM data that was originally loaded into the programmable logic device may be reloaded into the device. These are merely illustrative error-handling actions that may be taken when a CRAM error is located. In general, any suitable actions may be taken.

An illustrative programmable logic device 10 in accordance with the present invention is shown in FIG. 1. Programmable logic device 10 may have input/output circuitry 12 for driving signals off of device 10 and for receiving signals from other devices via input/output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources may be considered to be a part of programmable logic 18.

Programmable logic device 10 contains memory cells 20 that can be loaded with configuration data using pins 14 and input/output circuitry 12. Loaded CRAM cells 20 each provide a corresponding static control output signal that controls the state of an associated logic component in programmable logic 18. The output signals are typically applied to the gates of metal-oxide-semiconductor (MOS) transistors.

The circuitry of device 10 may be organized using any suitable architecture. As an example, the logic of programmable logic device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

Figure 2:
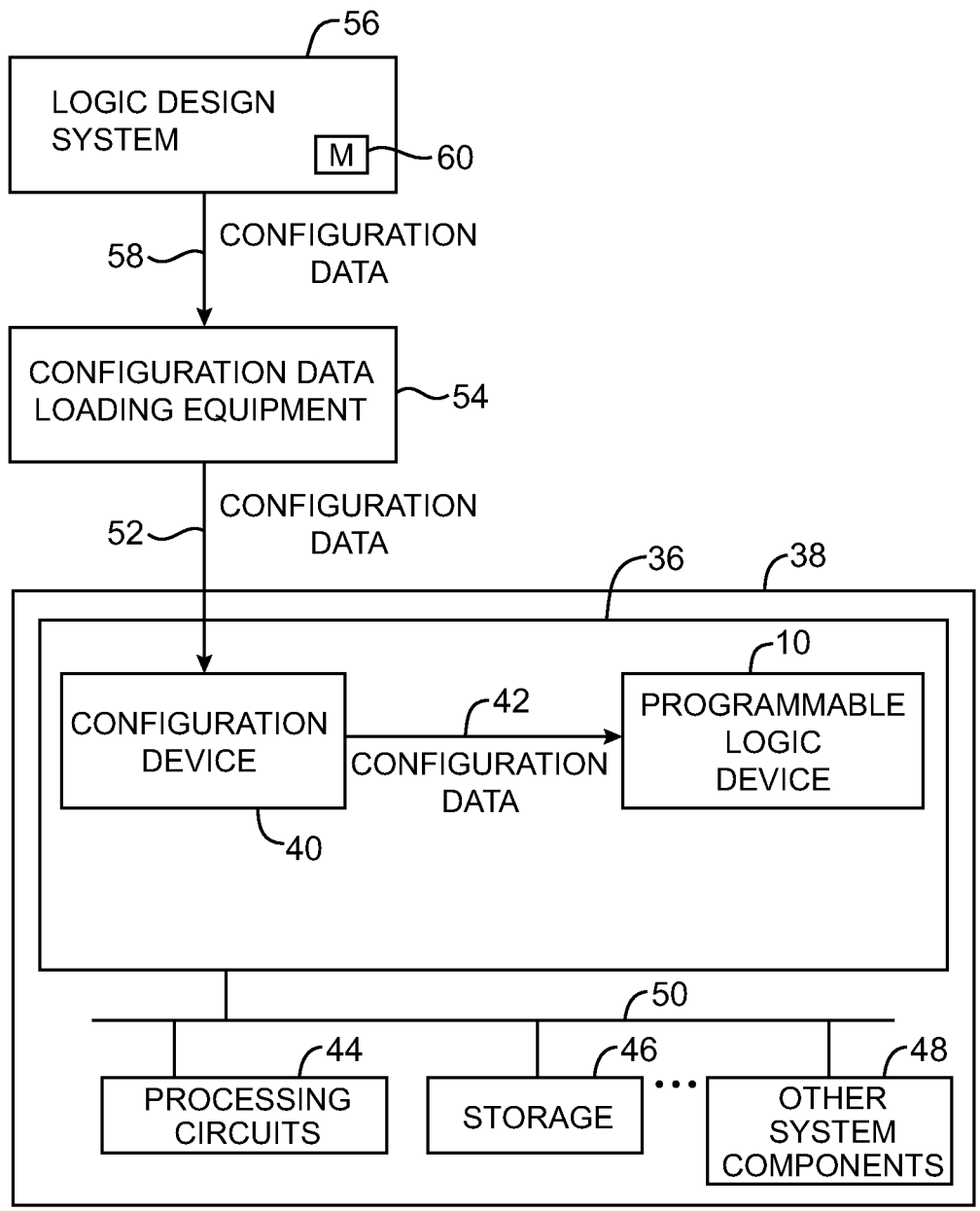
FIG. 2 is a diagram showing how programmable logic device configuration data is created by a logic design system and loaded into a programmable logic device to configure the device for operation in a system in accordance with the present invention.

An illustrative system environment for a programmable logic device 10 is shown in FIG. 2. Programmable logic device 10 may be mounted on a board 36 in a system 38. In general, programmable logic device 10 may receive configuration data from programming equipment or from any other suitable equipment or device. In the example of FIG. 2, programmable logic device 10 is the type of programmable logic device that receives configuration data from an associated integrated circuit 40. With this type of arrangement, circuit 40 may, if desired, be mounted on the same board 36 as programmable logic device 10. The circuit 40 may be an erasable-programmable read-only memory (EPROM) chip, a programmable logic device configuration data loading chip with built-in memory (sometimes referred to as a configuration device), or any other suitable device. When system 38 boots up (or at another suitable time), the configuration data for configuring the programmable logic device may be supplied to the programmable logic device from device 40, as shown schematically by path 42. The configuration data that is supplied to the programmable logic device may be stored in the programmable logic device in its configuration random-access-memory elements 20.

System 38 may include processing circuits 44, storage 46, and other system components 48 that communicate with device 10. The components of system 38 may be located on one or more boards such as board 36 or other suitable mounting structures or housings and may be interconnected by buses and other electrical paths 50.

Configuration device 40 may be supplied with the configuration data for device 10 over a path such as path 52. Configuration device 40 may, for example, receive the configuration data from configuration data loading equipment 54 or other suitable equipment that stores this data in configuration device 40. Device 40 may be loaded with data before or after installation on board 36.

It can be a significant undertaking to design and implement a desired logic circuit in a programmable logic device. Logic designers therefore generally use logic design systems based on computer-aided-design (CAD) tools to assist them in designing circuits. A logic design system can help a logic designer design and test complex circuits for a system. When a design is complete, the logic design system may be used to generate configuration data for electrically programming the appropriate programmable logic device.

As shown in FIG. 2, the configuration data produced by a logic design system 56 may be provided to equipment 54 over a path such as path 58. The equipment 54 provides the configuration data to device 40, so that device 40 can later provide this configuration data to the programmable logic device 10 over path 42. System 56 may be based on one or more computers and one or more software programs. In general, software and data may be stored on any computer-readable medium (storage) in system 56 and is shown schematically as storage 60 in FIG. 2.

In a typical scenario, logic design system 56 is used by a logic designer to create a custom circuit design. The system 56 produces corresponding configuration data which is provided to configuration device 40. Upon power-up, configuration device 40 and data loading circuitry on programmable logic device 10 is used to load the configuration data into the CRAM cells 20 of device 10. Device 10 may then be used in normal operation of system 38.

Due to strikes from alpha particles and cosmic rays, the loaded CRAM cells are subject to soft errors. The change in state of even a single CRAM bit may disrupt the operation of device 10, so programmable logic devices that are used in critical applications typically have error detection circuitry. The error detection circuitry monitors the CRAM array for faults.

Figure 3:
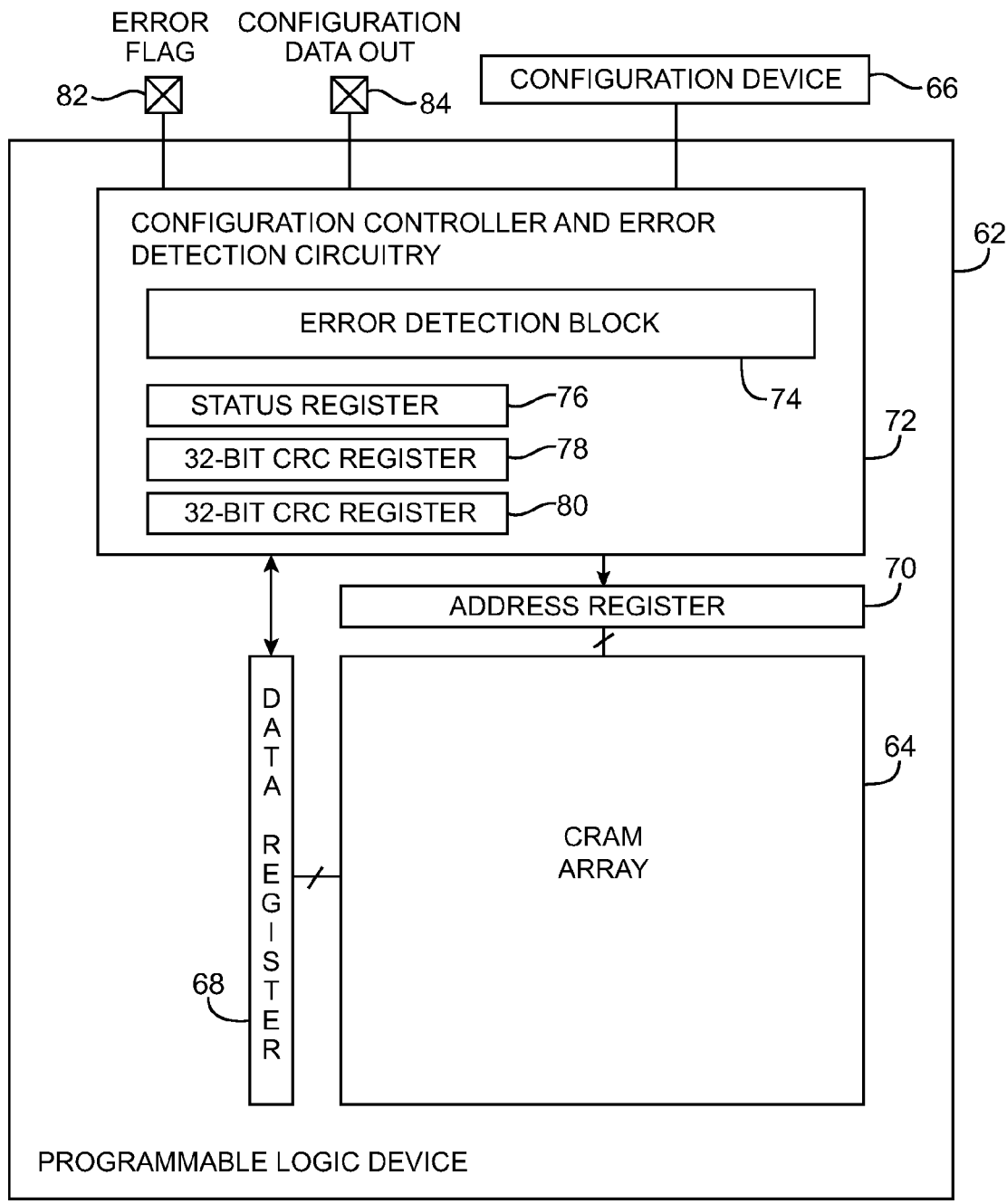
FIG. 3 is a diagram of a conventional programmable logic device integrated circuit containing error detection circuitry.

A conventional programmable logic device with error detection circuitry is shown in FIG. 3. As shown in FIG. 3, device 62 contains an array of configuration random-access-memory cells 64. CRAM array 64 is loaded with configuration data from configuration device 66. The cells of CRAM array 64 are addressed using address register 70 and data register 68. Configuration controller and error detection circuitry 72 controls configuration data loading operations. During loading operations, circuitry 72 computes a 32-bit cyclic-redundancy-check (CRC) code corresponding to the entire CRAM array 64. This CRC value is stored in register 78.

After data loading is complete, configuration controller and error detection circuitry 72 can confirm that the configuration data has been properly loaded by reading back the loaded configuration data. Configuration data may be read out of array 64 via configuration data out pin 84. Following successful programming of device 62, device 62 is used in a system.

During normal operation in a system, device 62 uses error detection block 74 to monitor CRAM array 64 for soft errors (if monitoring is enabled). Error detection block 74 continuously computes new values of the 32-bit CRC code for CRAM array 64 and stores the newly-computed CRC result in register 80. Block 74 compares the stored CRC value in register 78 to the newly-computed CRC value in register 80. If the CRC for the original CRAM data and the newly-computed CRC do not match, circuitry 72 can conclude that an error has occurred in CRAM array 64 and can take appropriate action. For example, circuitry 72 can update error status information in status register 76. The contents of status register 76 may be monitored by circuitry on device 62. Circuitry 72 can also take an error flag to a high value, which external circuitry can monitor using pin 82.

Figure 4:
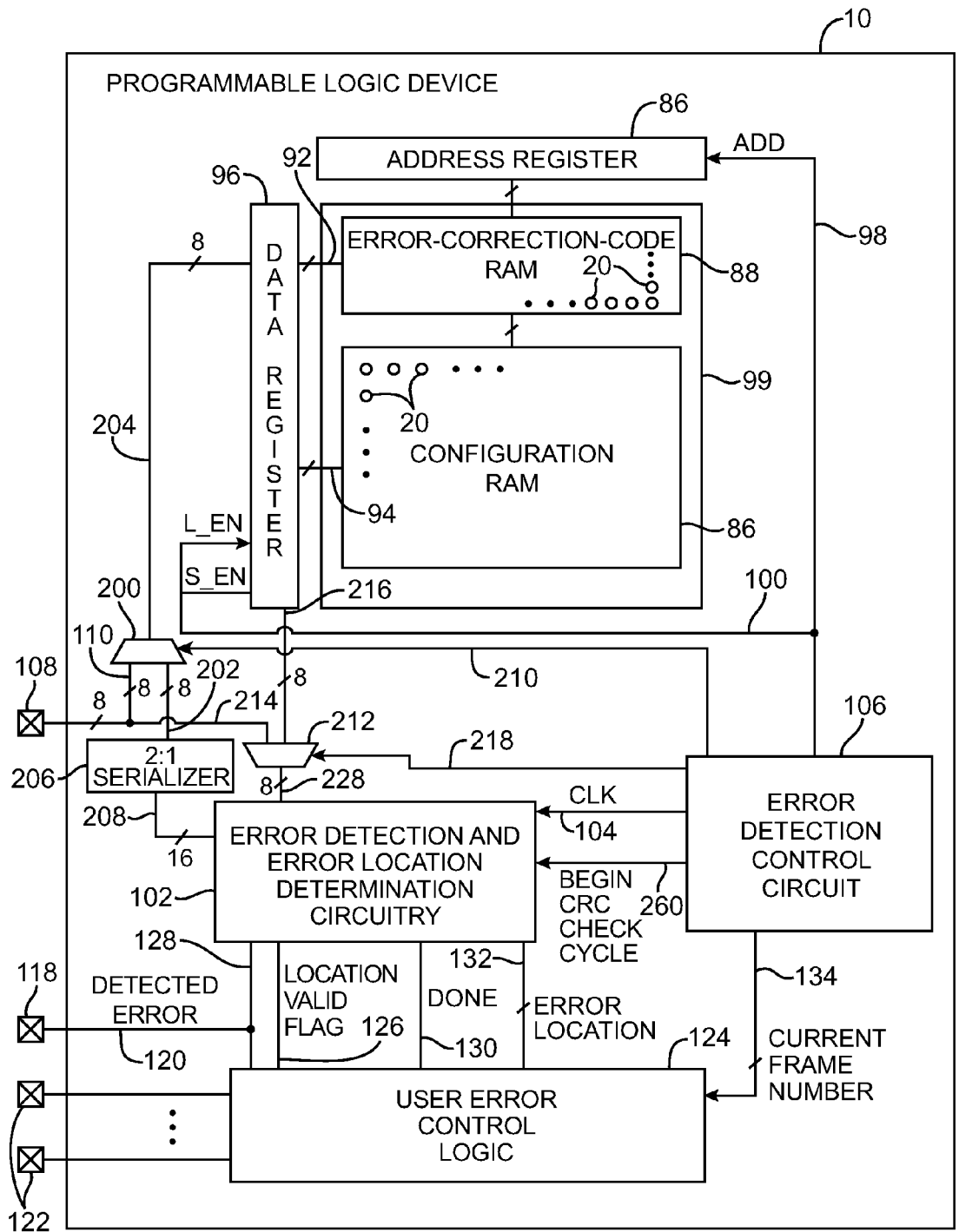
FIG. 4 is a diagram of a programmable logic device integrated circuit containing error detection and error location determination circuitry in accordance with the present invention.

A programmable logic device integrated circuit 10 with error detection and error location determination capabilities in accordance with the present invention is shown in FIG. 4. Programmable logic device 10 has an array 99 of random-access-memory cells 20. The RAM array 99 contains a CRAM array 86 and error-correction-code (ECC) RAM array 88. Array 86 is used to store configuration data. The outputs of the memory cells in array 86 are applied to the gates of transistors on device 10 to configure device 10 to perform its desired custom logic function. Array 88 is used to store error-correction-code data for array 86.

In general, any suitable error correction coding technique may be used in device 10. The use of a cyclic redundancy check (CRC) error correction coding arrangement is described as an example.

Error correction check bits such as CRC error correction check bits are computed for multiple subsets of the CRAM data in array 86. This provides error detection and error location determination circuitry 102 with sufficient information to extract error location information from the data in array 99 when a fault is detected. The subsets of data that are processed may have any suitable size. With one suitable arrangement, data is processed in frames and each column of RAM array 99 forms a frame. The sizes used for arrays 86 and 88 depend on the complexity of device 10 and the strength of the error correction code algorithm that is used.

As an example, consider the situation in which array 86 contains 6000 rows and thousands of columns and in which a CRC-16 error correcting code algorithm is used to compute the error correction check bits for array 88. In this scenario, each column of configuration data in array 86 contains 6000 configuration bits. Each frame in array 99 contains a column of CRAM bits and a column of CRC bits. For example, the sixth frame of array 99 contains the sixth column of 6000 CRAM bits from array 86 and the sixth column of 16 CRC bits from array 88.

Data is loaded into and read from array 99 using address register 86 and data register 96. Data register 96 uses data lines 92 to access array 88 and uses data lines 94 to access array 86. During data loading operations, the signal ADD on path 98 and register 86 are used to systematically assert various address lines in the columns of array 99. As each column of array 99 is addressed, data from data register 96 is loaded into that column over paths 92 and 94.

Device 10 has a multiplexer 200 that is controlled by error detection control circuit 106 using path 210. Multiplexer 200 has two eight-bit bus inputs—input 110 and input 202. When error detection control circuit 106 generates a control signal on path 210 with one state (e.g., a logic high), multiplexer 200 connects input 110 to its output. When error detection control circuit 106 generates a control signal on path 210 with another state (e.g., a logic low), multiplexer 200 connects input 202 to its output. The output of multiplexer 200 is connected to an eight-bit bus path 204. Path 204 routes signals to data register 96.

Multiplexer input 202 receives data signals from 2:1 serializer 206. Serializer 206 receives CRC data from error detection and error location determination circuitry 102. During operation, serializer 206 converts each 16-bit CRC data word on 16-bit wide path 208 into two corresponding 8-bit words on path 202.

Device 10 also has a multiplexer 212. Multiplexer 212 is controlled by error detection control circuit 106 using path 218. Multiplexer 212 has two eight-bit inputs, one of which receives signal from path 214, and the other of which receives signals from path 216. Error detection control circuit 106 generates a control signal on path 218 that sets the state of multiplexer 212. When the signal on path 218 has one value (e.g., a logic high), multiplexer 212 connects path 214 to its output. Path 216 is connected to its output when the signal on path 218 has another value (e.g., a logic low). The output of multiplexer 212 is connected to an eight-bit input of error detection and error location determination circuitry 102 via eight-line path 228.

When it is desired to load configuration data into array 99, error detection control circuit 106 directs multiplexer 200 to connect its input 110 to its output and directs multiplexer 212 to connect path 214 to its output. Shifting operations in data register 96 are enabled by asserting the S_EN signal on path 100. Configuration data is then supplied to device 10 via input pins 108 (e.g., eight input pins 108 corresponding to the eight lines of paths 110 and 214). The configuration data is routed to data register 96 via path 110, multiplexer 200, and path 204. As each frame of configuration data is being loaded into data register 96, a duplicate copy of the configuration data is routed into error detection and error location determination circuitry 102 via path 214 and multiplexer 212. Error detection and error location determination circuitry 102 computes a 16-bit CRC word for the frame. After the frame has been loaded into data register 96, error detection control circuit 106 directs multiplexer 200 to connect input path 202 to path 204. The 16-bit CRC word produced by error detection and error location determination circuitry 102 is converted from a 16-bit format into an eight-bit format by 2:1 serializer 206 and is shifted into the data register 96 through multiplexer 200 immediately following the frame of configuration data.

Figure 5:
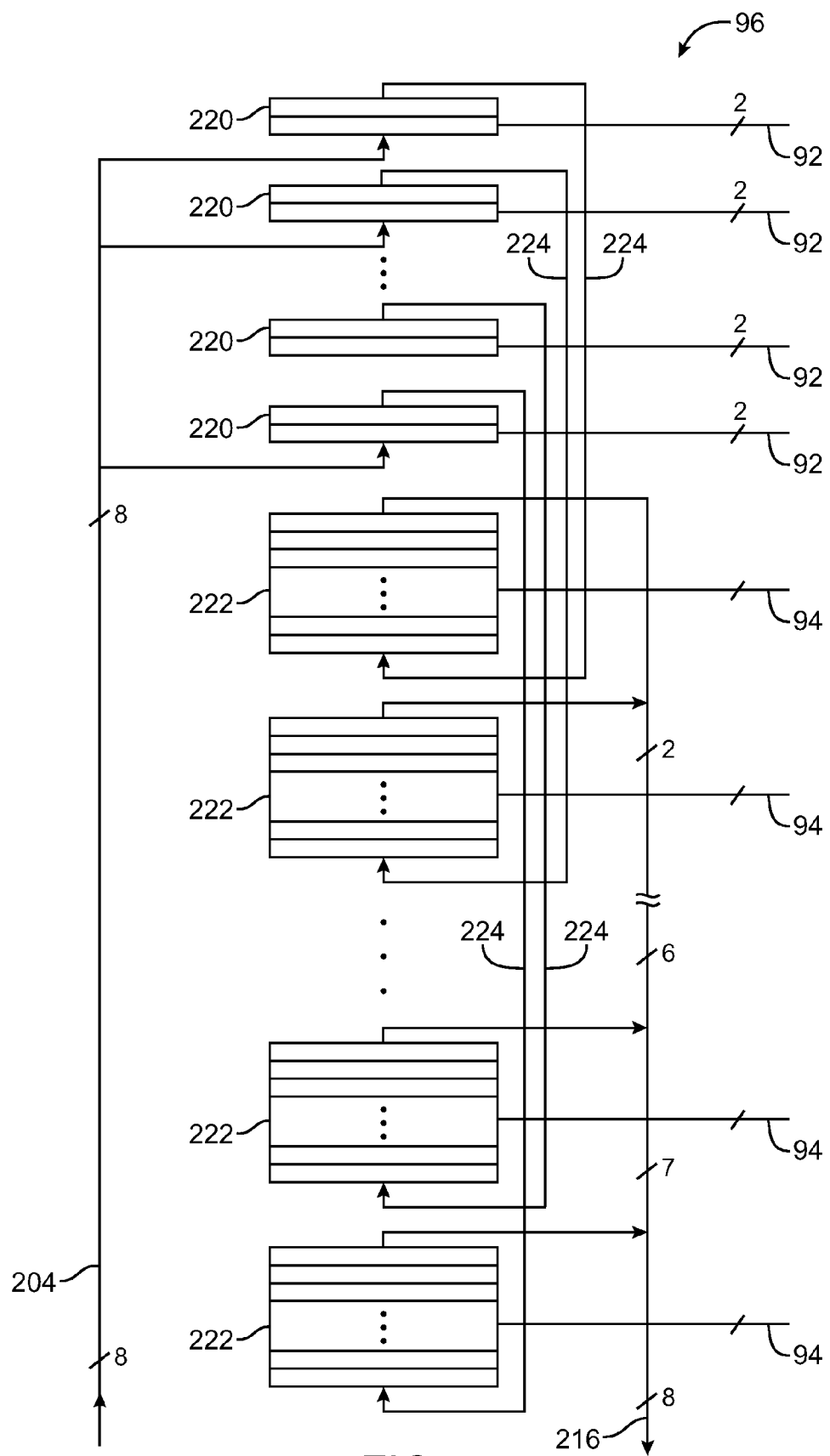
FIG. 5 is a circuit diagram of an illustrative data register used in accessing a memory array in a programmable logic device integrated circuit in accordance with the present invention.

An illustrative data register 96 is shown in FIG. 5. As shown in FIG. 5, data register 96 contains eight two-bit register segments 220 for loading data into array 88 via data lines 92. Data register 96 also contains eight multi-bit register segments 222 for loading data into array 86 via data lines 94. The size of segments 222 is determined by the size of array 86. For example, if there are 6000 rows in array 86, each segment 222 contains 750 (6000 divided by eight) bits. In the present example, the circuitry of FIG. 4 processes configuration data and cyclic redundancy check data in parallel using eight-bit buses, but in general, any suitable number of bits may be processed in parallel.

The eight lines of path 204 are used to distribute incoming configuration data to register segments 220. Because there are 6000 bit of configuration data, while register segments 220 are only two bits deep, the configuration data flows through segments 220 and is routed into segments 222 via paths 224.

After each 6000-bit frame of configuration data has been loaded into register 96 by shifting the data through segments 220 and 222, each segment 220 is filled with two bits of configuration data and each segment 222 is filled with 748 bits of configuration data. As multiplexer 200 is switched and the corresponding 16 bits of CRC data are provided to register 96 from error detection and error location determination circuitry 102, the two bits of configuration data in each segment 222 are shifted into a corresponding segment 222 and are replaced by two bits of CRC data. Following the configuration data loading process, segments 222 are filled with 6000 bits of configuration data and segments 220 are filled with 16 corresponding bits of CRC data. The CRC data in segments 220 represents the expected CRC value for the 6000 bits of configuration data in the absence of any soft errors.

After data register 96 has been loaded in this way, the configuration data and corresponding CRC data in register 96 is loaded into an appropriate column of array 99. A desired address signal ADD for address register 86 is asserted on path 98 to identify the active column during loading operations. The loading process continues until all desired frames of configuration data and CRC data have been loaded into array 99.

After the array 86 has been loaded with columns of configuration data and after the array 88 has been loaded with corresponding columns of CRC error correction check bits, the device 10 may be used in a system such as system 38 of FIG. 2. During normal operation, error detection and error location determination circuitry 102 continually monitors the data in array 99 for soft errors.

Data is read out from array 99 using address register 86 and data register 96. Error detection control circuit 106 uses path 98 and address register 86 to systematically assert column addresses for array 99. With one suitable approach, a single address bit is asserted at a time in sequence. Each time a column of array 99 is addressed, the load enable signal L_EN is taken high by error detection control circuit 106 to load the contents of that column into data register 96. The 16-bits of ECC RAM data in the addressed column are loaded into register segments 220. The 6000 bits of configuration data in the addressed column of array 86 are simultaneously loaded into register segments 222. Information on the location of the currently addressed column is provided on line 134 (e.g., in the form of a multi-bit signal). The circuitry of circuit 106 works in conjunction with the error detection and error location determination circuitry 102 and is therefore sometimes referred to as error determination and error location determination circuitry.

After each column of data is loaded from array 99, into register 96, error detection control circuit 106 takes the shift enable signal S_EN high. The data in register 96 is then shifted out of register 96 into error detection and error location determination circuitry 102 in parallel. As shown in FIG. 5, the output of each register segment 222 is connected to a respective one of the eight lines in path 216. During shifting operations, error detection control circuit 106 directs multiplexer 212 to route signals from path 216 to error detection and error location determination circuitry 102 over path 228. A clock signal CLK is used during shifting. The clock signal CLK is applied to error detection and error location determination circuitry 102 by error detection control circuit 106 using clock path 104. The clock signal CLK is also applied to the individual registers in register 96.

The eight lines of data from register 96 are processed in parallel by error detection and error location determination circuitry 102. The data that is processed includes the column of configuration data that has been read back from array 86 and the expected CRC data that was previously computed for that column and stored in array 88. During processing, circuitry 102 detects whether a soft error has occurred in the frame. The location of the frame that contains the detected error within array 86 serves as a form of location information for the error bit. For example, if an error is detected during processing of the second frame, the error detection and error location determination circuitry 102 and error detection control circuit 106, which maintains information on the current frame number, can conclude that the error is located in the second frame. Under many circumstances, error detection and error location determination circuitry 102 can further process the data from register 96 to determine the exact bit location of the error within the frame (e.g., cell number 3457 of the second frame).

Information on the detection of a soft error and error location information can be provided to other circuitry using any suitable scheme. With one suitable scheme, information on the current frame number being processed is provided by error detection control circuit 106 over path 134, as shown in FIG. 4. Information on the location of the error is provided by error detection and error location determination circuitry 102 over path 132. Paths 132 and 134 may be implemented using parallel buses of appropriate widths.

Paths such as paths 128, 126, and 130 can also be used to supply information on error status. The DETECTED ERROR signal on path 128 may be asserted (e.g., taken to a logic high value) whenever circuitry 102 detects a CRAM error. The LOCATION VALID FLAG signal on path 126 may be asserted whenever circuitry 102 has successfully determined the location of a detected error within a frame. When the signal on path 126 is asserted, the ERROR LOCATION signal on path 132 is valid. Path 130 may be used to provide a DONE signal. The signal DONE may be asserted when the circuitry 102 is finished processing a column of ECC and configuration data from array 99.

Error status signals such as these may be monitored by off-chip and on-chip logic. In the example shown in FIG. 4, the DETECTED ERROR signal on path 128 is provided to external circuitry using path 120 and pin 118. The signals on paths 126, 128, 130, 132, and 134 are monitored by error control logic 124. Error control logic 124 may be implemented using hardwired logic and/or user-programmed core logic on programmable logic device 10 (e.g., part of programmable logic 18 of FIG. 1). Control logic 124 may provide raw and processed signals to external components using pins such as pins 122.

Based on internal and/or external processing, a decision may be made about how to handle a detected error. The decision may be based at least in part on the location of the error. For example, if it is determined that the error has occurred within a portion of the configuration RAM array 86 that was not being used to actively configure a portion of the programmable logic 18 in the user's custom logic design, the error may be left uncorrected. This avoids disrupting the system 38 in which the programmable logic device 10 is operating. If, however, it is determined that a soft CRAM error has occurred in a portion of the CRAM array 86 that contains configuration data bits (or that contains important configuration data bits), appropriate corrective actions can be taken. Potential corrective actions that may be taken include reloading the original configuration data into array 86, reloading a portion of the configuration data into array 86, reloading different configuration data into all or some of array 86, asserting a system-level alarm flag, etc.

Figure 6:
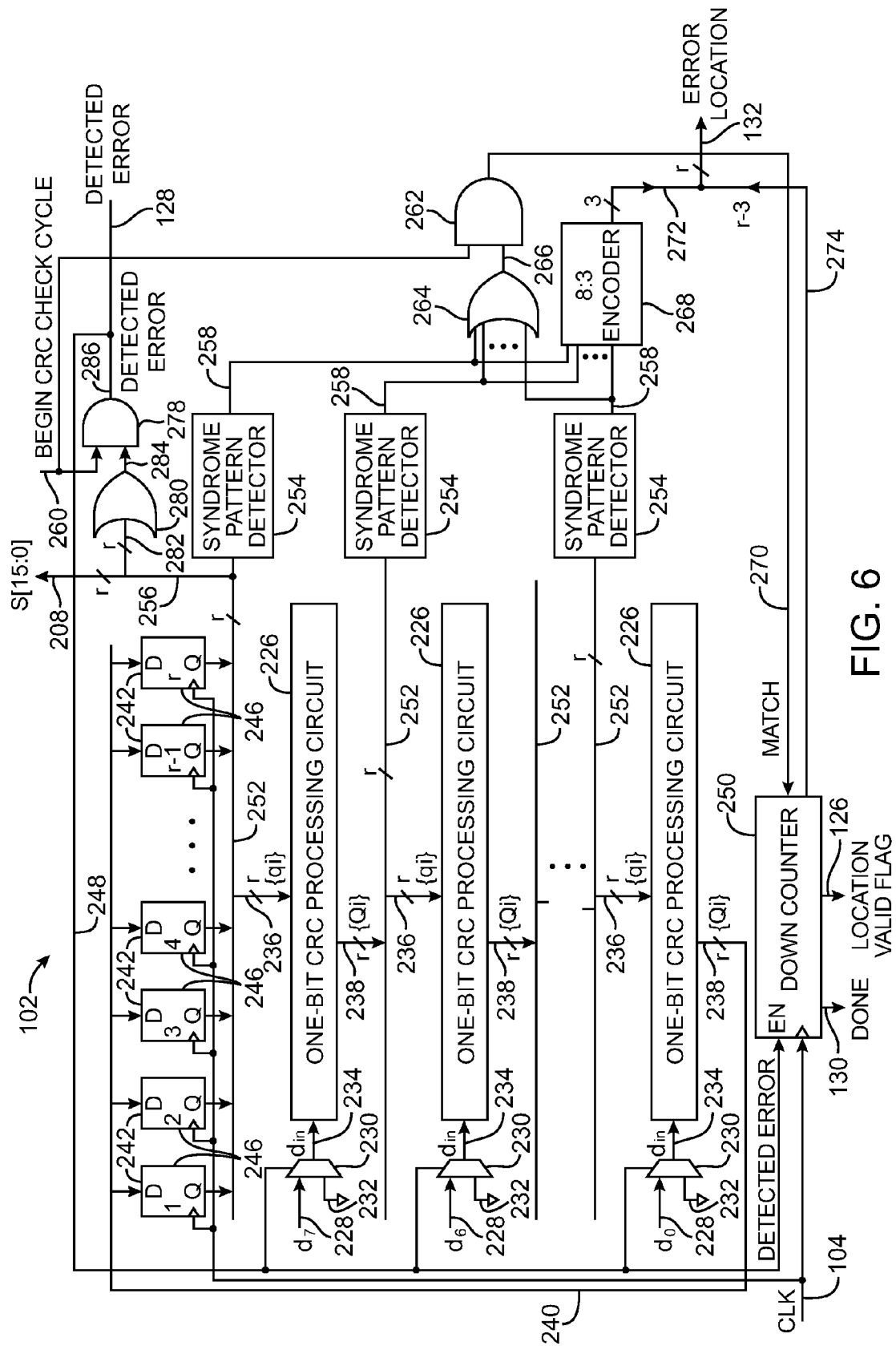
FIG. 6 is a circuit diagram of illustrative parallel processing error detection and error location determination circuitry that may be used in a programmable logic device integrated circuit of the type shown in FIG. 4 in accordance with the present invention.

The error detection and error location determination circuitry 102 may be implemented using a parallel processing architecture of the type shown in FIG. 6. The circuitry of FIG. 6 is based on a CRC error correction code arrangement. As shown in FIG. 6, error detection and error location determination circuitry 102 contains eight parallel one-bit cyclic redundancy check processing circuits 226. Data is shifted out of data register 96 using eight-bit path 216, multiplexer 212, and eight-bit path 228. The eight lines of path 228 are labeled $d_0, \ldots d_6$, and $d_7$ in FIG. 6.

Multiplexers 230 have two inputs and an output. Input lines 228 receive the data from register 96. Input lines 232 are connected to ground (i.e., a source of logic zero signals). The output 234 of each multiplexer 230 is provided to the data input $d_{in}$ of a respective one-bit CRC processing circuit 226. Multiplexers 230 are controlled by the state of the DETECTED ERROR signal on path 248. The signal DETECTED ERROR is also used to control down counter 250. As shown in FIG. 6, path 248 is used to route the DETECTED ERROR signal to the enable input EN of down counter 250.

Each one-bit CRC processing circuit 226 has a sixteen-bit input 236 and a sixteen-bit output 238. The one-bit processing circuits 226 are organized in a loop. Output from the last one-bit CRC processing circuit 226 in the loop (the lowermost one-bit CRC processing circuit 226 in FIG. 6) is routed to registers 246 via feedback path 240 and register inputs 242. Registers 246 are used for staging the signals being fed back to the combinational logic of circuits 226. Each register 246 receives a clock signal CLK from path 104. The clock signal CLK on path 104 is also provided to down counter 250.

Cyclic redundancy check processing involves computing a syndrome S from the input data $\{d_i\}$ on paths 228 using a CRC generator polynomial g(x). The circuitry 102 uses CRC processing circuits 226 to implement CRC processing using equations 1 and 2.

$$Q_i = q_r + d_{in} \text{ for } i=1 \tag{1}$$

$$Q_i = q_{i-1} + (Q_r + d_{in})g_{i-1} \text{ for } i=2\ldots r \quad (2)$$

In equations 1 and 2, $d_{in}$ represents the input data on data input lines 234. The parameters $\{g_{i-1}\}$ are the coefficients the generator polynomial g(x). The parameter r is equal to the degree of the CRC polynomial being used. In the present example, r is equal to 16. The parameters $\{q_i\}$ and $\{Q_i\}$ denote the current states and the next states of the one-bit CRC processing circuits 226, respectively. As shown in FIG. 6, each CRC processing circuit 226 receives r bits of $\{q_i\}$ data at its input 236 and produces a corresponding r bits of $\{Q_i\}$ data at its output 238.

The circuits 226 perform polynomial division modulo g(x). The result of the polynomial division operations are called syndromes. Paths 252 convey the syndromes produced by circuits 226 to corresponding syndrome pattern detectors 254. Each path 252 conveys a different syndrome. The first (uppermost) path 252 conveys the syndrome of $x^{r+i}$ mod g(x) to the first syndrome pattern detector 254. The second path 254 conveys the syndrome of $x^{r+i+1}$ mod g(x) to the second syndrome pattern detector 254. This pattern continues for all CRC processing circuits 226. The last (lowermost) path 252 in FIG. 6 conveys the syndrome of $x^{r+i+7}$ mod g(x) to the last syndrome pattern detector 254. The syndrome S from the uppermost path 252 represents the 16 bits of CRC data for the frame and is provided to path 208 via path 256. As shown in FIG. 4, the CRC on path 208 is routed to data register 96 via serializer 206 and multiplexer 200 when multiplexer 200 connects its input 110 to path 204.

The syndrome pattern detectors 254 compare the syndrome signals on paths 252 to a fixed syndrome pattern. Each syndrome pattern detector has a corresponding output 258. When a syndrome pattern detector detects a match between the signals on its path 252 and its stored pattern, the output 258 of that pattern detector 254 is asserted (i.e., the output 258 goes high). The identity of the output 258 that goes high can be used to identify the bit position of a detected error (i.e., whether the error was associated with data $d_7$, data $d_6$, data $d_5$, etc.).

The output signals 258 from each of the eight syndrome pattern detectors 254 are provided to the inputs of OR gate 264 and 8:3 encoder 268. If none of the syndrome pattern detectors has detected a match between the syndrome at its input and its stored pattern, the outputs 258 will all be low and the output 266 of OR gate 264 will be low. If any of the output signals 258 goes high, the output 266 goes high. The output signal 266 is used to form a signal MATCH on path 270 that goes high when one of the syndrome pattern detectors 254 has successfully identified a match between the syndrome at its input and its stored pattern.

The signal BEGIN CRC CHECK CYCLE is received by error detection and error location determination circuitry 102 from error detection control circuit 106 via path 260. The BEGIN CRC CHECK CYCLE serves as a control input for AND gate 262. When BEGIN CRC CHECK CYCLE is high, gate 262 is enabled. When BEGIN CRC CHECK CYCLE is low, the output of gate 262 is always low.

The BEGIN CRC CHECK CYCLE signal gates off the output of OR gate 264 as data is being shifted into circuitry 102. During shifting operations, the syndrome pattern detectors produce intermediate signals that are not indicative of a error location. Once all data has been shifted from register 96 into error detection and error location determination circuitry 102, the error detection control circuit 106 takes BEGIN CRC CHECK CYCLE high. With BEGIN CRC CHECK high, the output 266 of OR gate 264 is released. If the output 258 of any of the syndrome pattern detectors 254 goes high during subsequent clock cycles as data continues to be shifted in a loop through CRC processing circuits 226, MATCH will go high.

The identity of the syndrome pattern detector 254 whose output 258 goes high indicates the bit position of the detected error within the eight bits of the data byte $\{d_i\}$ currently being processed. The 8:3 encoder 268 converts the eight position signals on lines 258 into a three-bit binary-encoded bit position signal on path 272. Down counter 250 maintains a count of the processing clock cycles after BEGIN CRC CHECK CYCLE is asserted. The value of the count when an error is detected is indicative of the byte location of the error within the 6016 bits in the frame. Down counter 250 provides a binary-encoded version of the count on r−3 lines in path 274. Paths 274 and 272 are combined to form path 132. The r−3 bits of byte location information on path 274 and the 3 bits of bit-location information on path 272 form an r-bit ERROR LOCATION signal on path 132.

The BEGIN CRC CHECK CYCLE signal on path 260 is provided to one of the two inputs to AND gate 278. As data is being shifted into circuitry 102 from register 96, the BEGIN CRC CHECK CYCLE is low, indicating that circuitry 102 is not yet performing error detection and error location determination functions. When BEGIN CRC CHECK CYCLE is low, the output 286 of AND gate 278 is low and the signal DETECTED ERROR on paths 128 and 248 is zero. When the frame of data from register 96 has been shifted into circuitry 102, BEGIN CRC CHECK CYCLE is taken high, which enables gate 278 and allows the signal on its input 284 to pass to its output 286.

The OR gate 280 receives the syndrome S from path 256 at its r input lines 282. If any of the syndrome values is high during CRC checking, an error has been detected, and the output 284 of OR gate 280 goes high. Because BEGIN CRC CHECK CYCLE is high, gate 278 is enabled, and the high signal on output 284 is passed to path 286 as a high DETECTED ERROR SIGNAL.

Figure 7:
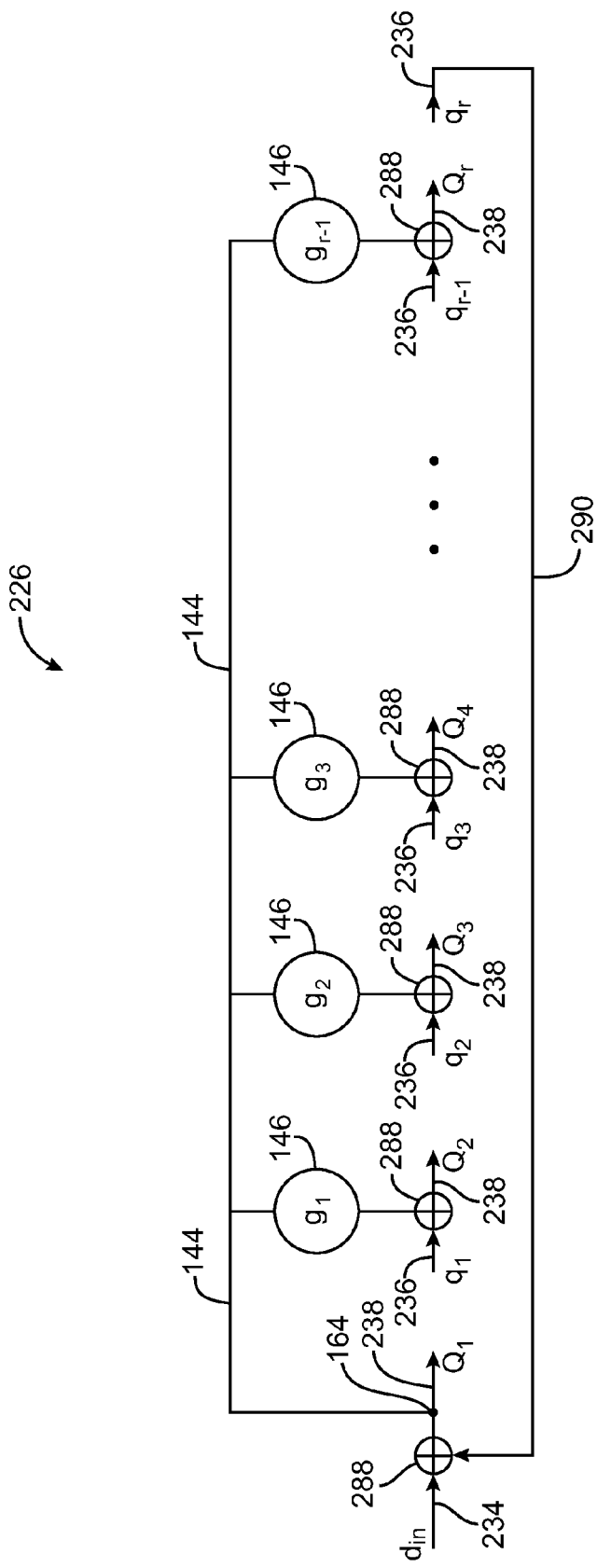
FIG. 7 is a diagram of a one-bit cyclic redundancy check processing circuit that may be used in error detection and error location determination circuitry of the type shown in FIG. 6 in accordance with the present invention.

An illustrative one-bit CRC processing circuit 226 is shown in FIG. 7. Circuit 226 has exclusive OR gates 288. There are r exclusive OR gates 288 in circuit 226, where r corresponds to the strength of the CRC algorithm being used (i.e., r=16 for 16-bit CRC). Circuit 226 has input lines 236 that receive input signals $\{q_i\}$ and output lines 238 at which output signals $\{Q_i\}$ are provided. The output from an associated multiplexer 230 in FIG. 6 is received at input line 234. A feedback path 240 routes the output of the last input 236 (input $q_r$) to one of the two inputs to the first (leftmost) exclusive OR gate 288. The other input to that exclusive OR gate 288 is provided on line 234.

Paths 144 convey signals from node 164 to the inputs of various exclusive OR gates 288 via connections 146. Some of connections 146 form open circuits and some of connections 146 form short circuits. The state of each connection 146 (i.e., whether open or shorted) is determined by the value of a corresponding CRC generator polynomial.

As shown in FIG. 7, the connections 146 are labeled ($g_1, g_2, g_3, \ldots, g_{r-1}$) and represent corresponding coefficients of the CRC generator polynomial g(x). In general, any suitable polynomial g(x) may be used, depending on the strength and type of CRC functionality that are desired.

An illustrative CRC polynomial g(x) that may be used for circuit 226 is shown in equation 3.

$$g(x) = x^{16} + x^{15} + x^2 + 1 \quad (3)$$

When the equation for g(x) that is shown in equation 3 is used in circuit 102, the value of $g_{15}$ and $g_2$ are 1. The other $\{g_i\}$ values are zero (the highest order and lowest order terms $g^{16}$ and $g_0$ are always present and as such represent special cases that are not used in determining the states of the connections 146).

Figure 8:
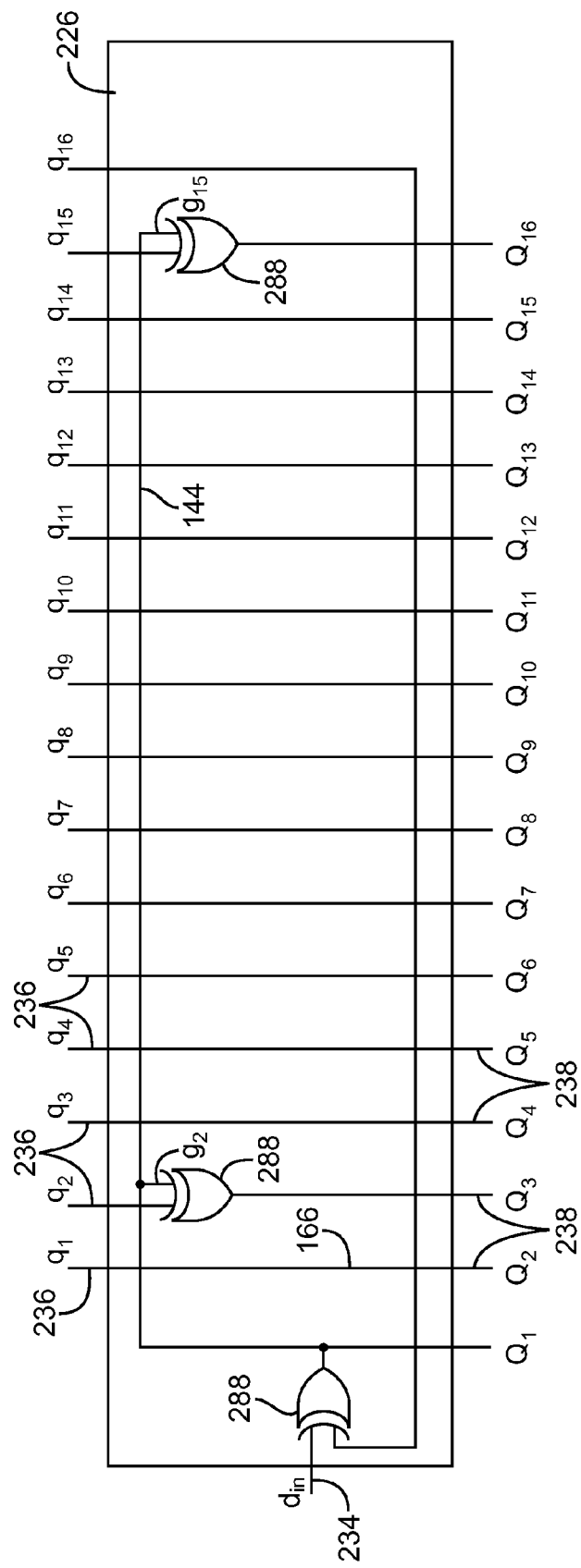
FIG. 8 is a diagram of an illustrative one-bit cyclic redundancy check processing circuit that may be used in performing 16-bit cyclic redundancy check syndrome calculations in error detection and error location determination circuitry of the type shown in FIG. 6 in accordance with the present invention.

FIG. 8 shows the circuit implementation of circuit 226 of FIG. 6 when a g(x) polynomial of the type shown in equation 3 is used. As shown in FIG. 7, when a $g_i$ coefficient is not present in equation 3, there is a hardwired connection between an input 236 and a corresponding output 238. For example, because there is no coefficient $g_1$ in equation 3 (i.e., $g_1=0$), there is a hardwired connection 166 between input $q_1$ and output $Q_2$. When a $g_i$ coefficient in FIG. 8 is present, there is a hardwired path connecting path 144 to one of the two inputs to its corresponding exclusive OR gate 288. The other input to the exclusive OR gate is connected to the associated input 236. For example, the coefficient $g_2$ is present in equation 3 (i.e., there is a non-zero polynomial term $x^2$ in equation 3), so there is an exclusive OR gate 288 between input $q_2$ and output $Q_3$ that receives as one of its two inputs a signal from path 144 via a hardwired connection $g_2$. The circuit diagram of FIG. 7 is generalized for any CRC generator polynomial g(x). The circuit example of FIG. 8 corresponds to the use of the CRC generator polynomial g(x) of equation 3.

As shown in FIG. 6, the signal DETECTED ERROR is fed back to the control input to input multiplexers 230 via path 248. While DETECTED ERROR is low, each multiplexer 230 connects its DATA IN input 228 to its output 234 and a low enable signal is provided to down counter circuit 250 via line 248. This allows the frame of configuration data and error correction bits from register 96 to be shifted to into circuitry 102. After the frame has been shifted into circuitry 102, AND gate 278 is enabled. Shifting continues to identify and locate errors. If DETECTED ERROR goes high during these subsequent shifting operations, down counter 250 is enabled via path 248 and each multiplexer 230 connects its grounded input 232 to its output 234. Each grounded input 232 provides a source of logic zeros to its associated one-bit CRC processing circuit 226 and is therefore sometimes referred to as the "zero input" of its multiplexer 230. The zero input of each multiplexer 230 remains connected to the output of that multiplexer 230 for the remainder of the processing operations for the current frame. This shifts logic zeros into the circuits 226. During the shifting operations of circuitry 102 after the signal BEGIN CRC CHECK CYCLE on line 158 has been taken high, syndrome pattern detectors 254 continuously monitor the syndrome signals on paths 252 and compares these signals to a predefined pattern of signals $\{u_i\}$. If a monitored syndrome matches the predefined pattern, the error detection and error location determination circuit 102 can conclude that an error has been located. In this situation, the signal MATCH on line 270 is taken high.

Down counter 250 maintains a count (called DOWN COUNT) as bits are shifted through circuitry 102. When the down counter 250 senses that MATCH has gone high, counting is stopped and a valid ERROR LOCATION signal is provided on output line 132. The down counter also sets the signal DONE on line 130 to a high value to indicate that processing is complete. The signal LOCATION VALID FLAG on line 126 is taken high to indicate that the ERROR LOCATION signal is valid and can be used with the correct frame number error location signal on path 134 of FIG. 4 to determine an appropriate action to take in response to the detected error.

Figure 9:
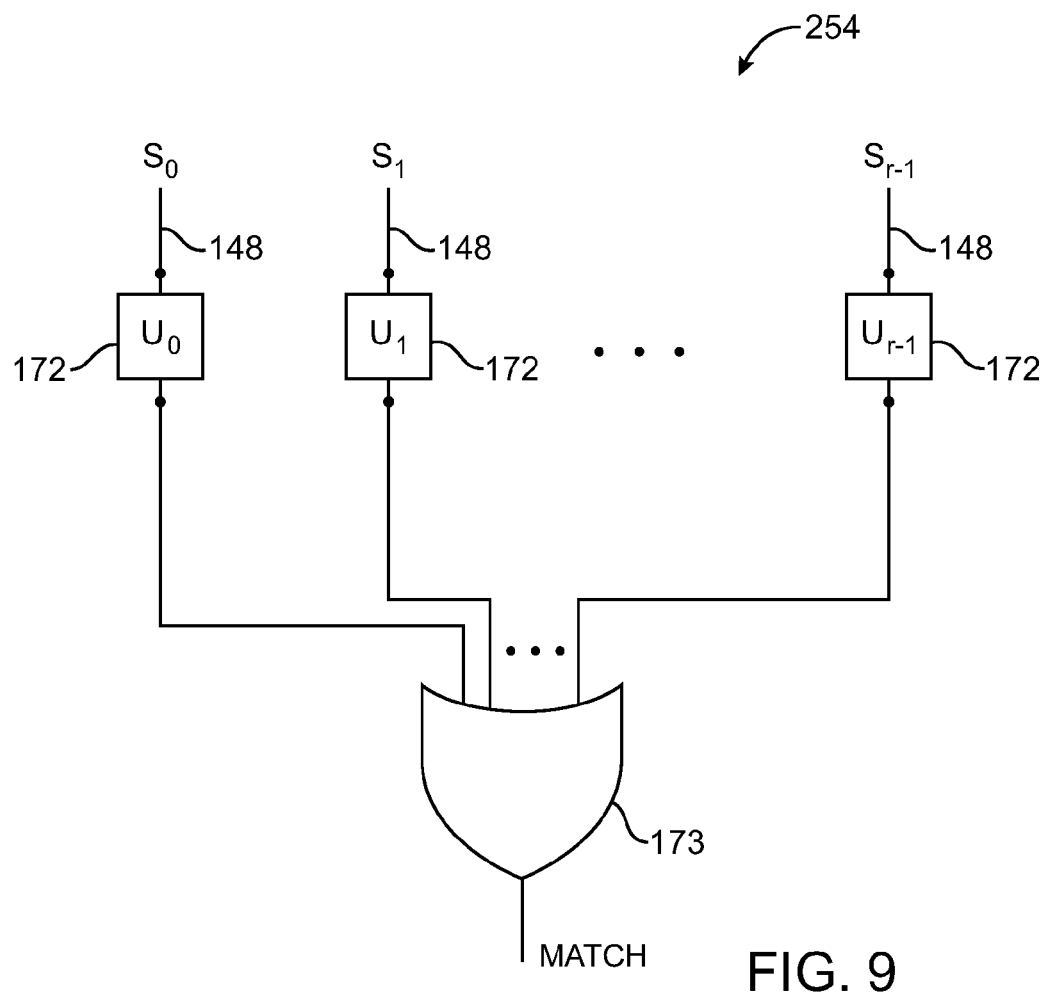
FIG. 9 is a generalized diagram of illustrative pattern detection circuitry that may be used in error detection and error location determination circuitry of the type shown in FIG. 6 in accordance with the present invention.

Each syndrome pattern detector 254 may use a circuit of the type shown in FIG. 9 to generate the MATCH signal. In FIG. 9, the boxes 172 are labeled with coefficients $\{u_i\}$. The coefficients $\{u_i\}$ represent the pattern being detected. The $\{u_i\}$ correspond to the terms of the remainder polynomial u(x) produced by the division of equation 4.

$$u(x)=x^{r+y} \bmod g(x) \quad (4)$$

In equation 4, g(x) is the CRC generator polynomial (e.g., the generator polynomial of equation 3). The value of r is determined by the CRC strength (e.g., r=16 for CRC-16). The value of y is given by the number of bits in register 96 (i.e., the number of bits in a frame including the configuration data bits from a given column of CRAM array 86 and the ECC RAM bits from the same given column of ECC RAM array 88).

Using equation 4, a set of $\{u_i\}$ are produced corresponding to the terms present in the function u(x). For example, if u(x) contains a term $x^w$, then $u_w=1$. If u(x) does not contain the term $x^w$, then $u_w=0$. In the circuit of FIG. 9, each box 172 that corresponds to a "1" represents an inverter. Each box 172 that corresponds to a "0" represents a direct path (short circuit). The outputs of boxes 172 are provided to OR gate 173. If any of the outputs of boxes 172 are high, the syndrome signals $\{s_i\}$ and the predefined pattern $\{u_i\}$ are said to form a match. In this situation, the signal MATCH at the output of OR gate 173 goes high.

Figure 10:
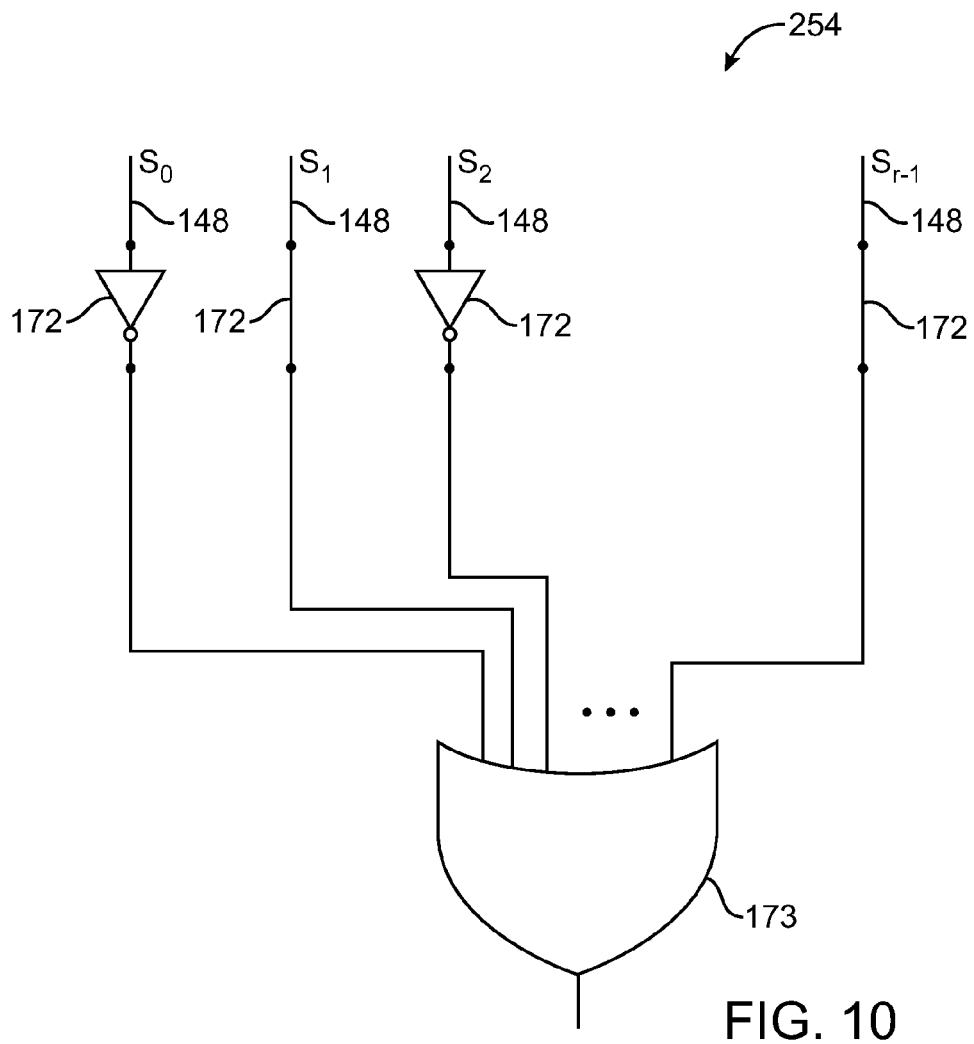
FIG. 10 is a more specific diagram of illustrative pattern detection circuitry that may be used in error detection and error location determination circuitry of the type shown in FIG. 6 in accordance with the present invention.
Figure 11:
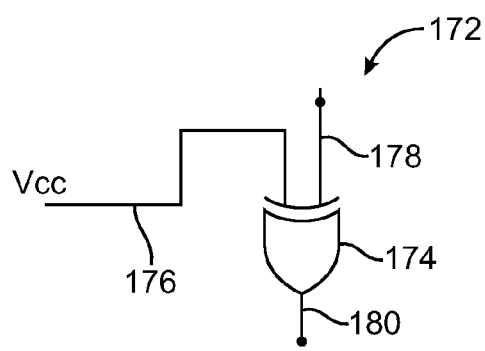
FIGS. 11 and 12 are diagrams of circuitry that may be used to implement different predefined patterns in pattern detection circuitry of the types shown in FIGS. 9 and 10 accordance with the present invention.
Figure 12:
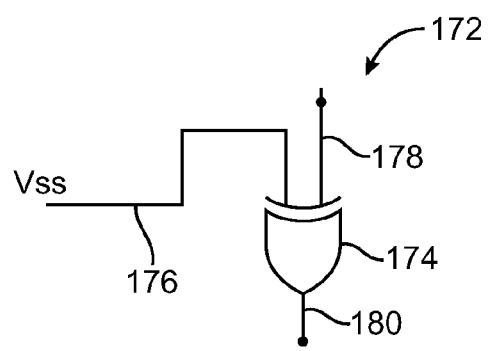

An example of a pattern detection circuit 254 in which the value of $u_0$ is 1, $u_1$ is 0, $u_2$ is 1, and $u_3$–$u_{r-1}$ are 0 is shown in FIG. 10. As shown in FIG. 10, elements 172 are formed using inverters or hardwired paths, as appropriate. A circuit layout for the circuit elements 172 may be custom designed for each programmable logic device integrated circuit in which a pattern detector 254 is desired. Alternatively, a layout-friendly approach may be used. This type of arrangement is illustrated in FIGS. 11 and 12. To avoid redesigning the circuit layout for elements 172 for each potentially new set of $\{u_i\}$, detector 254 uses circuit elements 172 based on exclusive OR gates 174. Exclusive OR gates 174 have one input 176 that is hardwired to either a logic high as shown in FIG. 11 or a logic low as shown in FIG. 12. Each exclusive OR gate 174 also has an input 178 that is connected to a respective one of the syndrome inputs 252. When it is desired to use a given element 172 to serve as an inverter, the input 176 of the gate 174 in that element is hardwired to a logic high signal such as a positive core logic power supply voltage Vcc, as shown in FIG. 11. When it is desired to use a given element 172 to serve as a short circuit (i.e., a non-inverting path), the input 176 of the gate 174 in that element is hardwired to a logic low signal such as core logic ground signal Vss, as shown in FIG. 12. Adjustments to the hardwired connections to the exclusive OR gates 174 do not require extensive layout changes to the pattern detector circuit 150, which facilitates implementation of pattern detector circuit 254 in a wide variety of integrated circuits.

Figure 13:
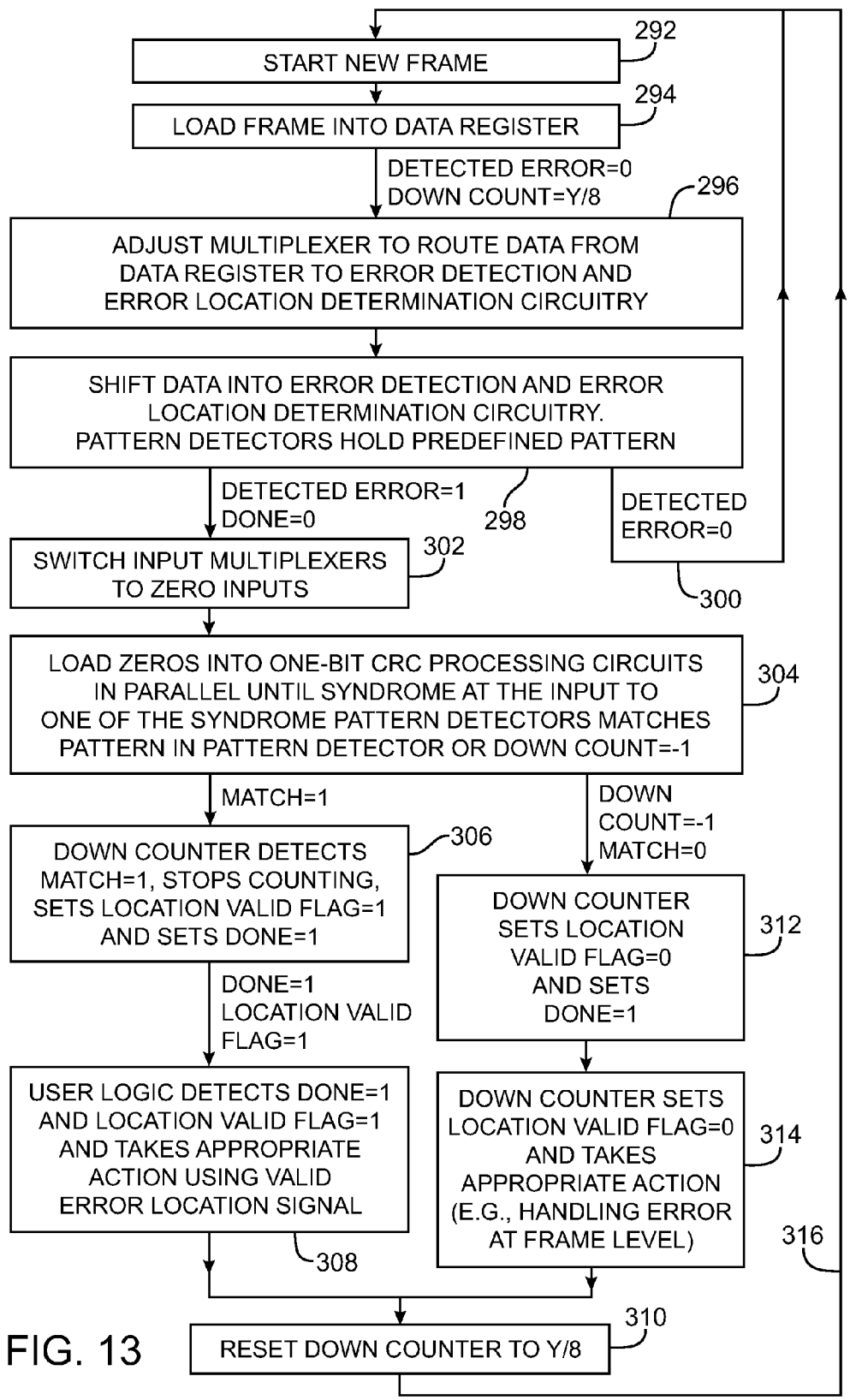
FIG. 13 is a flow chart of illustrative steps involved in using a parallel processing circuit arrangement to detect and locate configuration random-access-memory errors on an integrated circuit such as the programmable logic device integrated circuit of FIG. 6 in accordance with the present invention.

Illustrative steps involved in using the circuitry of FIGS. 4 and 6 while operating a programmable logic device 10 are shown in FIG. 13. During the operations of FIG. 13, a programmable logic device 10 that has been loaded with configuration data is used in a system such as the system 38 of FIG. 2. When configuration data was initially loaded into device 10 (e.g., from a configuration device 40 of the type shown in FIG. 2), error detection and error location determination circuitry 102 computed a CRC for each column of configuration data loaded into a column of array 86 (FIG. 4). The column of configuration data in array 86 and the corresponding column of CRC data in array 88 form a column of bits in array 99. Each column of CRC data and configuration data bits form a frame of data bits. During normal operations of device 10, error detection and error location determination circuitry 102 and 106 and additional error-handling circuitry such as user logic 124 are used to monitor the condition of array 99 and locate soft errors.

At step 292, processing of a new frame is started. The pattern in which the data of array 99 is processed is controlled by error detection control circuit 106. With one suitable approach, error detection control circuit 106 steps through each column of array 99 in sequence (e.g., processing the first frame in array 99, the second frame in array 99, the third frame in array 99, etc.). Other systematic techniques for processing the frames of array 99 may be used if desired. Error detection control circuit 106 selects each frame by using register 86 to assert an appropriate address signal for array 99. During step 292, the count of the down counter 250 (DOWN COUNT) is initialized (if necessary) to the frame size y divided by the number of lines in the parallel path 228. If, for example, there are eight lines in paths such as path 228, because configuration data is being processed in eight parallel streams, DOWN COUNT is initialized to y/8. The frame size y equals the number of rows in each column of CRAM array 86 (e.g., 6000) plus the number of rows in each column of ECC RAM array 88 (e.g., 16).

At step 294, the error detection control circuit 106 asserts the load enable signal L_EN on path 100 to load the frame of data corresponding to the currently-addressed column of array 99 into the data register 96. The frame of data that is loaded into register 96 includes the column of configuration random-access-memory bits from array 86 and the corresponding column of previously-computed CRC bits in error-correction-code RAM array 88. The column of bits from array 88 is loaded into register segments 220 (FIG. 5). The column of bits from array 86 is loaded into register segments 222 (FIG. 5). At the completion of step 294, the signal DETECTED ERROR on line 128 is low ("0"). The count of down counter 250 DOWN COUNT is set to its initial value of y/9 (e.g., 6016/8=752).

At step 296, error detection control circuit 106 directs multiplexer 212 to connect path 216 to path 228 (FIG. 4), so that data is routed from data register 96 to error detection and error location determination circuitry 102.

At step 298, the error detection control circuit 106 asserts the shift enable signal S_EN and the frame of data that was loaded into register 96 is shifted into error detection and error location determination circuitry 102. Data flows into circuitry 102 via path 216, multiplexer 212, and path 228. During these shifting operations, signal BEGIN CRC CHECK CYCLE is low, so that signal DETECTED ERROR is low. The low value of the DETECTED ERROR signal is provided to the control inputs of multiplexers 230 of FIG. 6 and directs the multiplexers 230 to connect their data in inputs 228 (labeled $d_0$, . . . $d_6$, and $d_7$ in FIG. 6) to their outputs 234. In this configuration, the data from the data registers flows into the one-bit CRC processing circuits 226 of FIG. 6. After the frame has been loaded, the BEGIN CRC CHECK CYCLE signal goes high, while the clock signal CLK continues to cycle. The syndrome pattern detectors 254 each hold the predefined pattern $\{u_i\}$. The syndromes from the outputs of the one-bit CRC processing circuits 226 are received by respective syndrome pattern detectors 254 via paths 252. The eight lines in the uppermost path 252 are connected to the inputs of OR gate 280 via path 282.

If the signals on path 282 are low when BEGIN CRC CHECK CYCLE goes high, the signal DETECTED ERROR on paths 128 and 248 will be low. Because no errors in the frame have been detected (in this scenario), processing loops back to step 292 so that the next frame of array 99 can be processed, as indicated by line 300.

If one or more of the signals on path 282 is high when BEGIN CRC CHECK CYCLE goes high, the DETECTED ERROR signal on lines 128 and 248 goes high. In this state, no counting has yet been performed by the down counter 250, so the signal DONE on line 130 is low.

The signal DETECTED ERROR is provided to the control inputs of multiplexers 230 via path 248 and is provided to the enable input of down counter 250. When the signal DETECTED ERROR goes high, multiplexers 230 connect their zero inputs 232 to their outputs 234 (step 302). Connecting zero (grounded) inputs 232 to the inputs of the one-bit cyclic redundancy checking processing circuits 226 in this way presents a logic low to each circuit 226.

At step 304, the frame of data is clocked through the loop made up of circuits 226, feedback path 240, and registers 246. Because a logic low signal is being presented at the input to each circuit 226, the data signal $d_{in}$ in each circuit 226 is a zero (FIG. 7) and zeros are loaded into each circuit 226 as the clock signal CLK increments. A count DOWN COUNT is maintained by the down counter 250 and is decreased by one with each cycle of CLK as the data is being processed by the circuitry of FIG. 6. Data processing continues until the syndrome at the output of one of the one-bit CRC processing circuits 226 matches the pattern in its corresponding syndrome pattern detector 254 or until the down counter 250 finishes counting down from its initial value (i.e., when the DOWN COUNT signal maintained by the down counter 250 reaches −1).

If the syndrome output of one of the circuits 226 matches the predefined pattern $\{u_i\}$ in its pattern detector 254, that pattern detector 254 takes the signal on its output 258 high and signal MATCH at the output of gate 262 goes high (i.e., to "1"). If DOWN COUNT reaches −1, the signal MATCH remains low (i.e., at "0"). During step 304, down counter 250 monitors the state of the MATCH signal on line 270.

If down counter 250 detects that MATCH has been taken high, the down counter 250 stops counting (step 306). Because MATCH has gone high, the down counter 250 can conclude that a successful match has been obtained. Accordingly, the down counter takes the LOCATION VALID FLAG signal high on output 126 and takes the DONE signal on line 130 high. At the same time, the down counter 250, syndrome pattern detectors 254, and 8:3 encoder 268 produce a valid ERROR LOCATION signal on output 132. The ERROR LOCATION signal is a multi-bit signal that indicates the location of the detected soft error within the bits of the frame. As an example, the ERROR LOCATION signal may produce a signal that indicates the detected error is located at bit position number 1463 out of 6000 CRAM bits in the frame. Setting the LOCATION VALID flag to "1" indicates that the signal ERROR LOCATION is valid and can be relied upon (in conjunction with the error location on line 134 of FIG. 4) by error control logic such as user error control logic 124 of FIG. 4.

The user logic 124 monitors the states of the signals DONE and LOCATION VALID FLAG. When the user logic 124 detects that LOCATION VALID FLAG and DONE are both high (step 308), the user logic 124 can conclude that an error has been detected and that its position within the frame has been determined. Error detection control circuit 106 provides information on line 134 specifying the number of the current frame being processed. Taken together, ERROR LOCATION and CURRENT FRAME NUMBER serve as an error location signal that indicates the bit position of the detected soft error within the array 99.

During step 308, appropriate corrective actions are taken. For example, error status and control signals may be provided on pins such as pins 122 of FIG. 4 that are monitored and processed by circuitry external to the programmable logic device. These signals may, as an example, initiate the reprogramming of device 10. An advantage of determining the location of the CRAM error is that it is not necessary to reprogram the array 99 each time an error is detected. In situations in which the error does not affect the CRAM bits that are actively being used, the device 10 may be allowed to operate uninterrupted.

If down counter 250 detects that counting has been completed while MATCH remains low (i.e., if DOWN COUNT is detected as reaching −1), the down counter 250 sets the value of LOCATION VALID FLAG to "0" (step 312). The signal DONE is taken high during step 312 to indicate that processing of the current frame is complete. In this situation, it is not possible to determine the location of the error within the frame, so the signal ERROR LOCATION is not valid.

At step 314, error control logic such as user-implemented error control logic 124 of FIG. 4 detects that the signal DONE is high and that the signal LOCATION VALID FLAG is low and takes appropriate action. Suitable actions include placing a signal on one or more of pins 122 that directs external circuitry to reload the configuration data into the array 86 to correct the detected error, setting a status register bit to a particular value, etc. If desired, the user logic can use the current frame number information provided by error detection control logic 106. For example, the user logic can store the current frame number in a status register or can provide this information to external circuitry via pins 122. Although the frame number by itself is insufficient to provide the bit position of the error within the array 99, the frame number may assist the user logic 124 in determining how to handle the detected error. If, as an example, the frame number corresponds to a portion of array 86 that does not contain actively used CRAM bits, the user logic can decide not to interrupt the operation of the programmable logic device for reprogramming.

At step 310, the down counter value DOWN COUNT is reset to the size of the frame y divided by eight (e.g., to 6016/8=752). Processing of the next frame continues by looping back to step 292, as indicated by line 316.

The error detection and location operations of FIG. 13 can locate errors in array 99 both in the CRAM portion (array 86) and the ECC RAM portion (array 88).

The foregoing is merely illustrative of the principles of this invention and various modifications can be made by those skilled in the art without departing from the scope and spirit of the invention.

What is claimed is:

1. A method, comprising:
   with a plurality of processing circuits in error detection and error location determination circuitry, receiving data from an array of memory cells on an integrated circuit in parallel;
   with each of a plurality of detector circuits, monitoring an output of a respective one of the plurality of processing circuits; and
   based on outputs from at least one of the detector circuits, determining the location of a soft memory cell error within the memory cells in the array of memory cells on the integrated circuit, wherein the memory cells are arrayed in rows and columns and wherein determining the location of the soft memory cell error comprises determining at which row and at which column the soft memory cell error is located in the array of memory cells; and
   determining whether the location of the soft memory cell error is within a non-critical portion or a critical portion of the array of memory cells.

2. The method defined in claim 1 further comprising:
   loading data into memory cells in the array of random-access-memory cells on the integrated circuit and loading corresponding error correction check bits into memory cells in the array, wherein determining the location of the soft memory cell error comprises using error detection and error location determination circuitry on the integrated circuit to process data from the memory cells to determine the location of the soft memory cell error within the memory cells.

3. The method defined in claim 2 wherein using the error detection and error location determination circuitry further comprises processing frames of data, each frame including a given column of data from the array of memory cells and a given corresponding column of error correction check bits from the memory cells in the array.

4. The method defined in claim 1 wherein determining whether the location of the soft memory cell error is within the non-critical portion or the critical portion of the array of memory cells comprises determining whether the location of the soft memory cell error is within a used portion or an unused portion of the array of memory cells.

5. The method defined in claim 1 wherein the array of memory cells comprises an array of configuration memory cells, wherein a first portion of the array of configuration memory cells are operable to configure logic in a given user logic design, wherein a second portion of the array of configuration memory cells are inactive in the given user logic design, and wherein determining whether the location of the soft memory cell error is within the non-critical portion or the critical portion of the array of memory cells comprises determining whether the location of the soft memory cell error is within the first or second portions of the array of configuration memory cells.

6. The method defined in claim 5 further comprising:
   if it is determined that the location of the soft memory cell error is within the first portion of the array of configuration memory cells, performing a step selected from the group consisting of: reloading data into the memory cells, reloading a portion of data into the memory cells, reloading new data into at least some of the memory cells, and asserting an alarm flag; and
   if it is determined that the location of the soft memory cell error is within the second portion of the array of configuration memory cells, leaving the soft memory cell error uncorrected.

7. The method defined in claim 1 further comprising:
   if it is determined that the location of the soft memory cell error is within the critical portion of the array of memory cells, performing a step selected from the group consisting of: reloading data into the memory cells, reloading a portion of data into the memory cells, reloading new data into at least some of the memory cells, and asserting an alarm flag.

8. The method defined in claim 1 further comprising:
   if it is determined that the location of the soft memory cell error is within the non-critical portion of the array of memory cells, leaving the soft memory cell error uncorrected.

9. A method of monitoring an integrated circuit, comprising:
   with a plurality of cyclic redundancy check processing circuits, receiving data from an array of memory cells on an integrated circuit in parallel;

with each of a plurality of pattern detectors, monitoring an output of a respective one of the plurality of cyclic redundancy check processing circuits; and based on outputs from at least one of the pattern detectors, determining the location of a memory cell error within the memory cells, wherein determining the location of the memory cell error comprises determining a column position and a row position of the memory cell error within the array of memory cells; and at least partly based on the location of the memory cell error, leaving the soft memory cell error uncorrected and uncompensated for.

10. The method defined in claim 9 wherein determining the location of the memory cell error comprises determining that the location of the memory cell error is within a non-critical portion of the array of memory cells.

11. The method defined in claim 9 wherein determining the location of the memory cell error comprises determining that the location of the memory cell error is within an unused portion of the array of memory cells.

12. The method defined in claim 9 wherein determining the location of the memory cell error comprises determining the location of a first memory cell error, the method comprising:

determining the location of a second memory cell error within the memory cells in the array of memory cells on the integrated circuit; and at least partly based on the location of the second memory cell error, performing a step selected from the group consisting of: reloading data into the memory cells, reloading a portion of data into the memory cells, reloading new data into at least some of the memory cells, and asserting an alarm flag.

13. The method defined in claim 12 wherein determining the location of the second memory cell error comprises determining that the location of the second memory cell error is within a critical portion of the array of memory cells.

14. The method defined in claim 12 wherein determining the location of the second memory cell error comprises determining that the location of the second memory cell error is within a used portion of the array of memory cells.

15. A method of monitoring an integrated circuit, comprising:

with a plurality of processing circuits, receiving data from an array of memory cells on an integrated circuit in parallel;

with each of a plurality of syndrome pattern detectors, monitoring an output of a respective one of the processing circuits; and based on outputs from at least one of the syndrome pattern detectors, determining the location of a memory cell error within memory cells in an array of memory cells on an integrated circuit, wherein determining the location of the memory cell error comprises generating a multi-bit location signal; and determining whether the location of the soft memory cell error is within a used portion or an unused portion of the array of memory cells.

16. The method defined in claim 15 wherein the array of memory cells comprises an array of configuration memory cells, wherein a first portion of the array of configuration memory cells are operable to configure logic in a given user logic design, wherein a second portion of the array of configuration memory cells are inactive in the given user logic design, and wherein determining whether the location of the soft memory cell error is within the used portion or the unused portion of the array of memory cells comprises determining whether the location of the soft memory cell error is within the first or second portions of the array of configuration memory cells.

17. The method defined in claim 16 further comprising:

if it is determined that the location of the soft memory cell error is within the first portion of the array of configuration memory cells, performing a step selected from the group consisting of: reloading data into the memory cells, reloading a portion of data into the memory cells, reloading new data into at least some of the memory cells, and asserting an alarm flag; and if it is determined that the location of the soft memory cell error is within the second portion of the array of configuration memory cells, leaving the soft memory cell error uncorrected.

18. The method defined in claim 15 wherein the array of memory cells is an array of configuration memory cells, wherein the used portion is operable to configure logic in a given user logic design, and wherein the unused portion is inactive in the given user logic design.

19. The method defined in claim 15 wherein the array of memory cells comprises columns of memory cells, wherein each column of memory cells forms a frame of data, and wherein the multi-bit location signal indicates the location of the memory cell error within a given one of the frames of data.

* * * * *